(12) United States Patent
Yang et al.

(10) Patent No.: US 8,644,068 B1
(45) Date of Patent: *Feb. 4, 2014

(54) METHOD AND SYSTEM FOR PROGRAMMING MULTI-STATE MEMORY

(75) Inventors: Xueshi Yang, Cupertino, CA (US); Zining Wu, Los Altos, CA (US)

(73) Assignee: Marvell International Ltd., Hamilton (BM)

(*) Notice: Subject to any disclaimer, the term of this patent is extended or adjusted under 35 U.S.C. 154(b) by 0 days.

This patent is subject to a terminal disclaimer.

(21) Appl. No.: 13/410,499

(22) Filed: Mar. 2, 2012

Related U.S. Application Data

(63) Continuation of application No. 12/404,570, filed on Mar. 16, 2009, now Pat. No. 8,144,510.

(60) Provisional application No. 61/039,885, filed on Mar. 27, 2008.

(51) Int. Cl.
 *G11C 11/34* (2006.01)

(52) U.S. Cl.
 USPC ............ 365/185.03; 365/185.01; 365/185.19; 365/185.23; 365/185.18; 365/185.24; 365/185.33; 365/189.16; 365/230.06; 365/233.16

(58) Field of Classification Search
 USPC ............. 365/185.01, 185.03, 185.19, 185.23, 365/185.18, 185.24, 185.33, 189.16, 365/230.06, 233.16
 See application file for complete search history.

(56) References Cited

U.S. PATENT DOCUMENTS

| | | |
|---|---|---|
| 2008/0316816 A1 | 12/2008 | Lin |
| 2009/0091991 A1 | 4/2009 | Cho et al. |
| 2010/0110787 A1 | 5/2010 | Shalvi et al. |

OTHER PUBLICATIONS

Pavan, P., et al., "Flash Memory Cells—An Overview," *Proceedings of the IEEE*, vol. 85, No. 8, pp. 1248-1271 (Aug. 1997).

*Primary Examiner* — Fernando Hidalgo

(57) ABSTRACT

In a multi-level memory cell, when data to be programmed arrives, the cell is programmed to the lowest-charge state in which any bit position that is being programmed or has already been programmed has the correct value, regardless of the value in that state of any bit position that has not yet been programmed and is not being programmed. The programming of other bit positions based on subsequently arriving data should not then require a transition to an impermissible lower energy state. Although this may result in a transient condition in which some bits have the wrong value, by the time programming is complete, all bits would be expected to have the correct value. A cell may contain any number of bits equal to or greater than two, and programming may be performed cyclically (e.g., from LSB to MSB), anticyclically (e.g., from MSB to LSB), or in any random order.

18 Claims, 7 Drawing Sheets

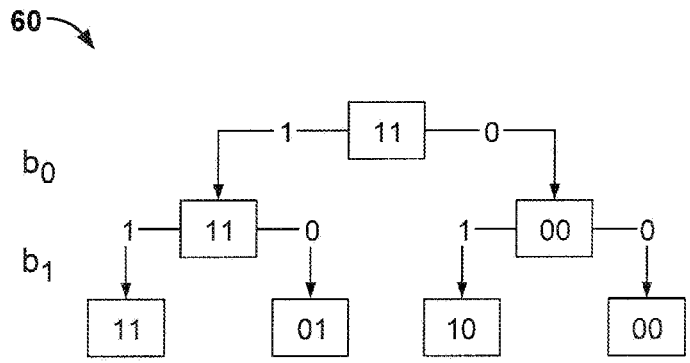
FIG. 7
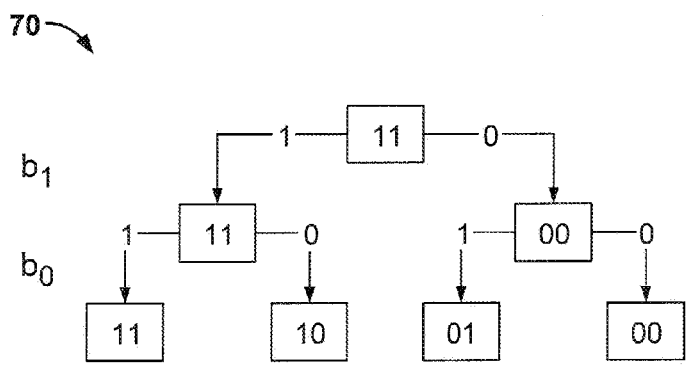
FIG. 8
| State # | 0 | 1 | 2 | 3 | 4 | 5 | 6 | 7 |
|---|---|---|---|---|---|---|---|---|
| State Encoding | 111 | 011 | 010 | 110 | 100 | 000 | 001 | 101 |
FIG. 9

METHOD AND SYSTEM FOR PROGRAMMING MULTI-STATE MEMORY

CROSS REFERENCE TO RELATED APPLICATION

This is a continuation of copending, commonly-assigned U.S. patent application Ser. No. 12/404,570, filed Mar. 16, 2009 (now U.S. Pat. No. 8,144,510), which claims the benefit of commonly-assigned U.S. Provisional Patent Application No. 61/039,885, filed Mar. 27, 2008, each of which is hereby incorporated by reference herein in its respective entirety.

BACKGROUND

This invention relates to a method and system for writing data to a memory or storage device that stores multiple bits per cell, and particularly to a method and system for reducing latency in writing data to such a storage device.

As discussed in more detail below, flash memory cells (in particular, floating gate flash memory cells) store data by changing the number of electrons trapped on the floating gate. A memory cell may be programmed by inserting electrons onto the floating gate (e.g., via channel hot-electron programming or Fowler-Nordheim tunneling), and a memory cell may be erased by extracting electrons from the floating gate. Programming a cell corresponds to moving the cell from a lower state (e.g., an erase state) to a higher state. Programming can be addressed to individual flash cells within an array of cells, while erasing typically can be performed only on all cells in an array of memory cells. Thus, during flash programming, only state transitions from a lower state to a higher state are permitted. Transitions in the other direction are not permitted, because moving to a lower state would mean erasing not only the cell being programmed, but all cells in the array.

When a flash device is being used as multilevel cell (MLC) flash memory to store multiple bits per cell, the physics of the device, as described above, may limit the state transitions that are permitted without completely erasing the cell and therefore the array. In known methods for programming such memory cells, whenever data are received that require changing the value of a bit position, the memory state of the cell is changed in such a way that all other bit positions retain their previous values. However, in such techniques, depending on the order in which bits arrive, this may require an invalid state transition for programming of a subsequent bit position, causing an error condition or failure.

Alternatively, the cell may not be rewritten until data for all bit positions to be programmed arrive, so that the final state is known before any writing occurs. The resulting latency may be particularly acute if the different bits, as is frequently the case, belong to different logical data pages. According to another alternative, the encoded states may be mapped to a different set of states that do not result in invalid state transitions, but this also requires waiting for all memory pages to arrive, causing latency.

SUMMARY

In accordance with the present invention, when data arrive for a multi-level memory cell, the cell is programmed to the lowest-charge state in which any bit position that is being programmed or has already been programmed has the correct value, regardless of the value in that state of any bit position that has not yet been programmed and is not being programmed. The programming of any other bit positions based on subsequently arriving data should not then require a transition to a lower energy state which would not be permitted. Although this may result in a transient condition in which some bits have the wrong value, by the time programming is complete, all bits would be expected to have the correct value.

Therefore, in accordance with the present invention, there is provided a method of storing data in a multilevel storage device. The method includes programming bits in an order of significance. For each bit being programmed, the state of the multilevel storage device is changed from a current charge state to a new charge state, where the new charge state is a lowest-charge state out of all possible states in which the bit being programmed, and any bit already programmed, have their programmed values (i.e., final desired values).

BRIEF DESCRIPTION OF THE DRAWINGS

Further features of the invention, its nature and various advantages, will be apparent upon consideration of the following detailed description, taken in conjunction with the accompanying drawings, in which like reference characters refer to like parts throughout, and in which:

FIG. 7 is a representation of a binary tree showing state changes as bits are programmed according to the mapping of FIG. 5 using an embodiment of the present invention, and starting from the least-significant bit;

FIG. 8 is a representation of a binary tree showing state changes as bits are programmed according to the mapping of FIG. 5 using an embodiment of the present invention, and starting from the most-significant bit;

FIG. 9 is a representation of a mapping of the charge states of a three-bit flash memory to particular data values, which mapping previously has been considered invalid;

DETAILED DESCRIPTION

Figure 1:
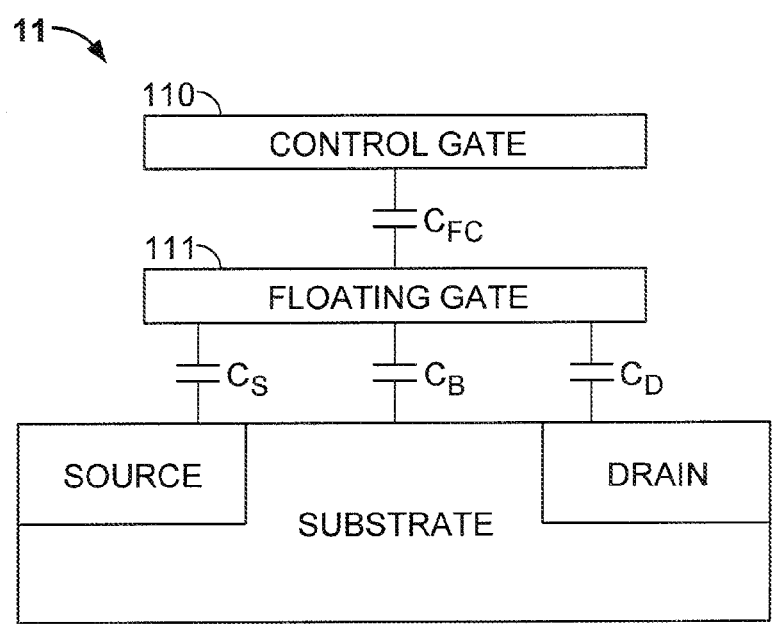
FIG. 1 is a transistor-level representation of a multi-level flash memory.

The structure of a floating-gate multi-level flash cell 11 is shown in FIG. 1. Upper gate 110 is the control gate and lower gate 111, completely isolated within the gate dielectric, is the floating gate. Floating gate 111 acts as a potential well. If a charge is forced into the well, the charge cannot move from the well without application of an external force. Therefore, floating gate 111 stores charge. The difficulty of removing charge from the potential well of floating gate 111 gives rise to the physical limitations discussed above, which require erasing all cells 11 in an array of such cells in order to reduce the amount of charge stored in any one of the cells. Because that is not acceptable, flash memory programming techniques typically allow only state changes representing increased charge storage levels. But known techniques either give rise to error conditions or failures, or involve delay or latency to avoid error conditions or failure.

As stated above, embodiments of the present invention rely on the recognition that it is not necessary to preserve the values, during programming steps for certain bit positions in a multi-level cell, of other bit positions that have not yet been programmed and are not being programmed in those steps. The values for those other bit positions will arrive later and can be programmed at that time, and there is no advantage to preserving the previous values of those bit positions. By focusing on lowest-energy or lowest-charge state that includes the bits that are already known, programming according to embodiments of the invention should not give rise to any prohibited state changes that would cause a programming operation to fail.

Figure 2:
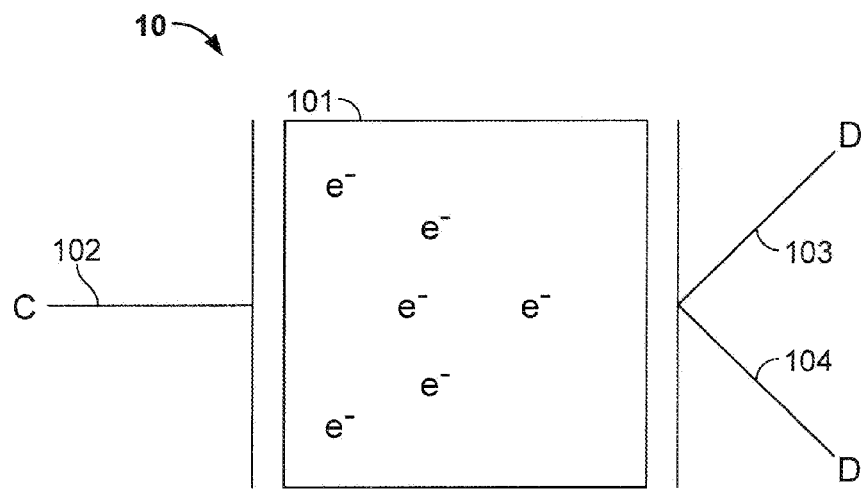
FIG. 2 is a schematic representation of a multi-level flash memory.

FIG. 2 shows a schematic representation of a multi-level memory cell 10 in which charge is stored in an isolated area 101 based on signals applied to terminals 102, 103, 104. The amount of charge stored determines the level of the cell, and each level can represent a different encoding state. Commonly, a "1" means the bit is unprogrammed, while a "0" means that charge has been added to increase the cell threshold.

Figure 3:
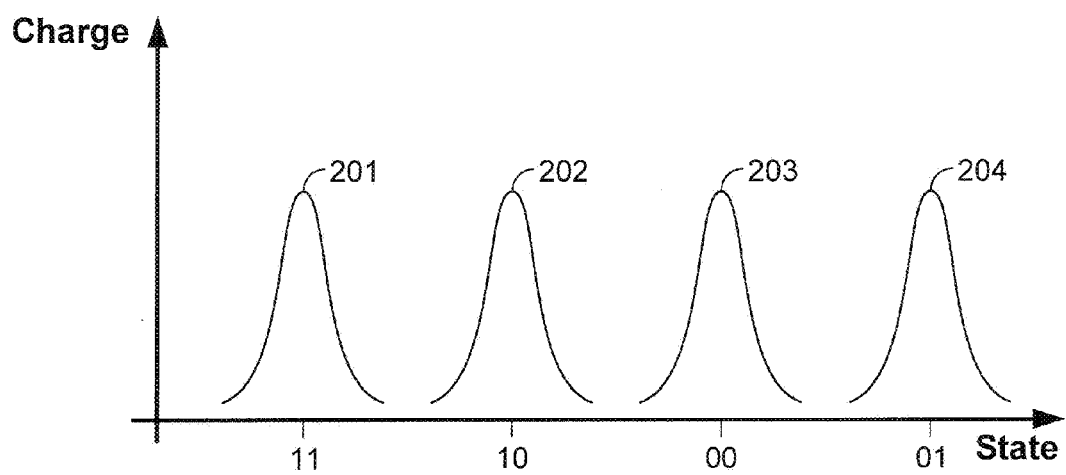
FIG. 3 is a representation of data storage levels in a multi-level flash memory.
Figure 4:
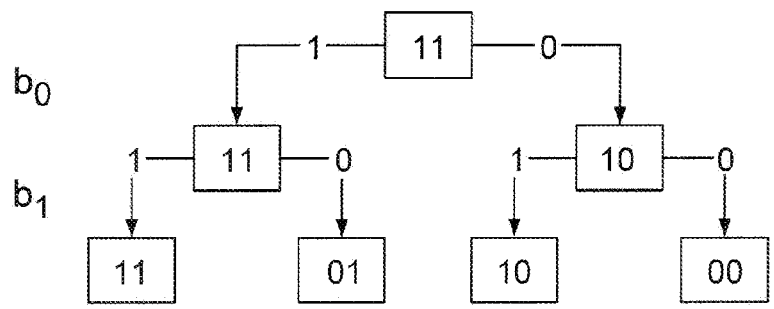
FIG. 4 is a representation of a binary tree showing state changes as bits are programmed according to the mapping of FIG. 3.

For example, FIG. 3 shows in simplified graphic form how a cell can store four different levels 201, 202, 203, 204 of charge representing four different data states, which can be encoded as the four possible states of two bits. In the example, state 201—the lowest-charge state—represents the "11" state, state 202 represents the "10" state, state 203 represents the "00" state, and state 204 represents the "01" state. This is considered a valid mapping of data states onto the charge states because all states can be reached by a change of one bit without moving from a higher-charge state to a lower-charge state, as shown in the binary tree of FIG. 4 where the first level represents programming the least significant bit (LSB) $b_0$ and the second level represents programming the most significant bit (MSB) $b_1$. In each case, the value to be programmed into the bit in question ($b_0$ or $b_1$) is shown superimposed on the arrow showing the respective transition.

Figure 5:
FIG. 5 is a simplified graphical representation of a mapping of the charge states of a two-bit flash memory to particular data values, which mapping previously has been considered invalid.
Figure 6:
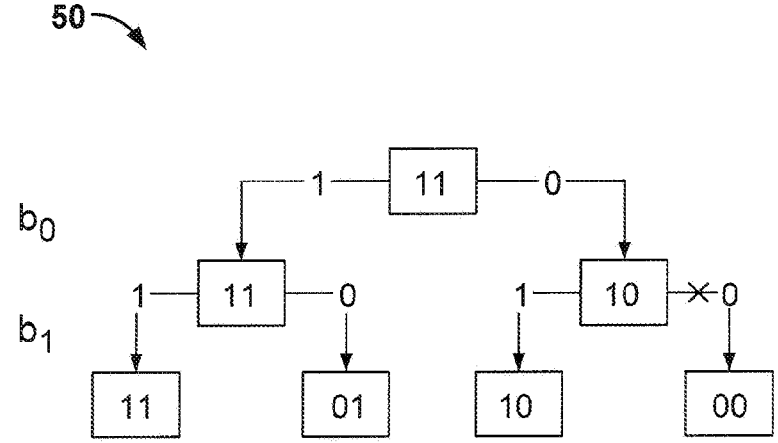
FIG. 6 is a representation of a binary tree showing state changes as bits are programmed according to the mapping of FIG. 5 using an embodiment of the present invention.

On the other hand, the mapping shown in FIG. 5, where state 401 represents the "11" state, state 402 represents the "00" state, state 403 represents the "10" state, and state 404 represents the "01" state, has heretofore been considered invalid, because when changing one bit at a time, going from the "10" state 403 to the "00" state 402 requires a decrease in charge, which is not possible. This is shown by an "X" in the binary tree 50 of FIG. 6. This data mapping could be used with known programming methods only by translating the data mapping to a different encoding scheme, which results in the latency issues discussed above if, as is frequently the case, the different bits belong to different memory pages.

In accordance with the method of the present invention, instead of changing only the bit currently being programmed, bits that have not yet been programmed and are not currently being programmed also may be changed, because their values until they are programmed do not matter. This allows one to move to the lowest-energy state in which bits that have already been programmed and are currently being programmed have the correct values. The starting point may be the erase state in which all bits are "1".

For example, in a two-bit system, when programming the first bit to be programmed—e.g., the least significant bit, the charge level may be increased to the lowest-charge state in which the bit of interest has the correct (or matching) value, regardless of the value of the other bit is in that charge state. That way, when the other bit is later programmed, that bit can be reached by moving to a higher-charge state rather than requiring an invalid transition to a lower-charge state. Using such a method, the mapping of FIG. 5 can be used without translation, as illustrated from the binary tree 60 of FIG. 7. As seen in FIG. 7, by allowing both bit values to change when programming only one bit, as long as the bit of interest assumes the correct value, all states can be reached by legal transitions. As seen from binary tree 70 of FIG. 8, the method also works if one starts with the most significant bit.

This can be generalized to any number of bits per cell. Thus, whether starting with the least significant bit and progressing through bits of greater significance, or starting with the most significant bit and progressing through bits of lesser significance, when programming any particular bit, one moves to the lowest-charge state in which the current bit and any bits already programmed have the correct values, without regard to the value in that state of any bit not yet programmed and not currently being programmed.

Figure 10:
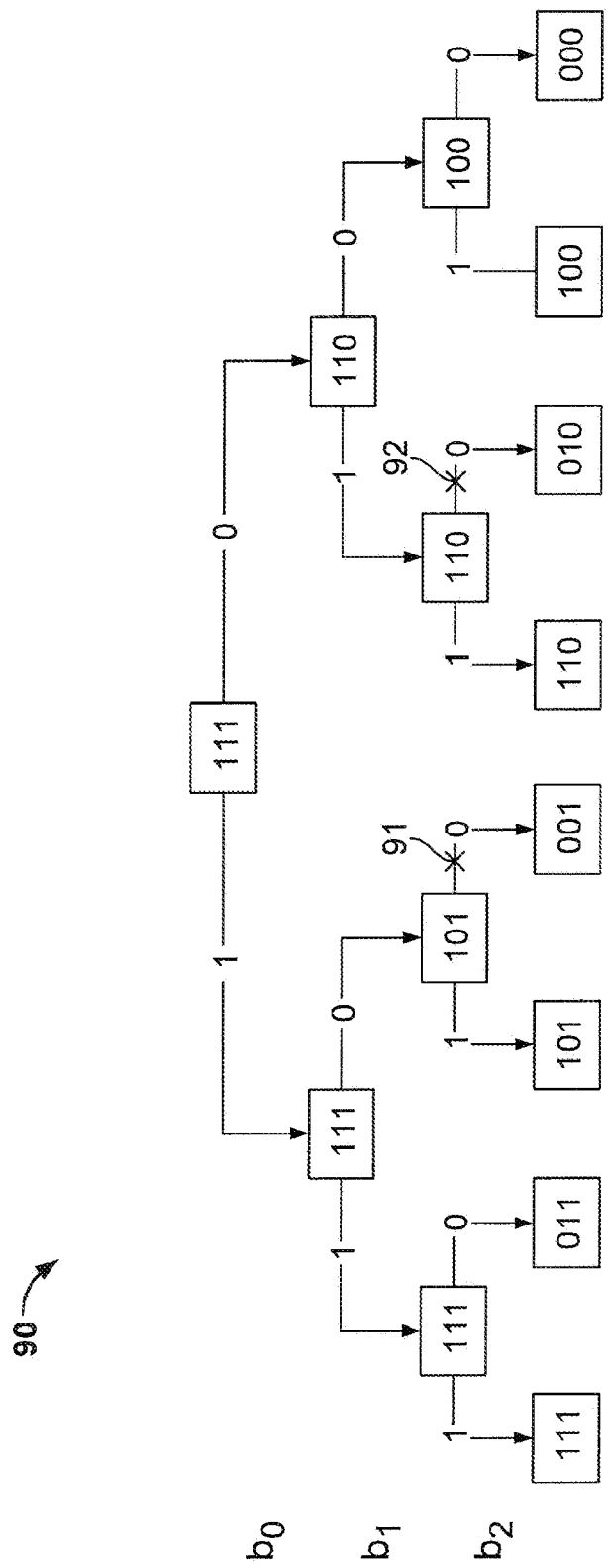
FIG. 10 is a representation of a binary tree showing state changes as bits are programmed according to the mapping of FIG. 9 according to known techniques.

Taking as an example the three-bit encoding scheme 80 of FIG. 9, one can see from the binary tree 90 of FIG. 10 that this encoding scheme would not be valid using a programming method that changes only the bit being programmed, because according to such a method each of the 101-to-001 transition 91 and the 110-to-010 transition 92 would be an invalid transition to a lower-charge state. Thus, encoding scheme 80 could only be used with translation as described above.

Figure 11:
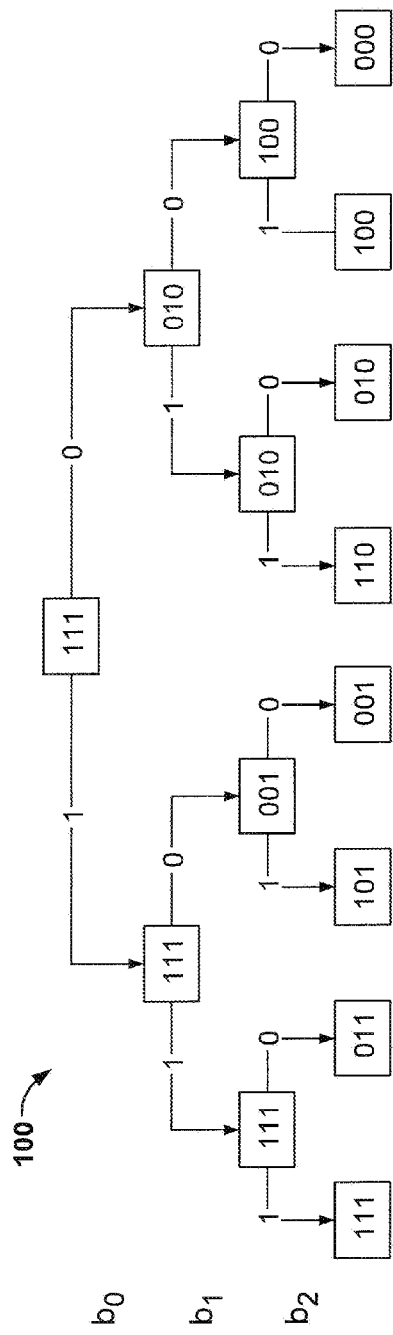
FIG. 11 is a representation of a binary tree showing state changes as bits are programmed according to the mapping of FIG. 9 using an embodiment of the present invention.

However, as seen from the binary tree 100 of FIG. 11, using an embodiment of a programming method according to the invention, in which bits not yet programmed and not currently being programmed may be changed (because their states do not matter until they are programmed), so that the state can be changed to the lowest-charge state in which the bit currently being programmed as well as any bit(s) already programmed assume the correct values, encoding scheme 80 can be valid.

This can be generalized to any number of bits per cell in the LSB-to-MSB programming order, assuming the goal is to program an M-bit multilevel cell from LSB to MSB. The bits to be programmed may be denoted as $b_{M-1}b_{M-2} \ldots b_0$, where $b_M$ is the MSB and $b_0$ is the LSB.

In such a case, programming may be performed according to the following loop:

For i=0 to M−1

Identify the current state of the cell and denote that state as $a_{M-1}a_{M-2} \ldots a_0$ if $a_i != b_i$ Starting from the current state, inspect each higher-charge state in order of increasing charge to find the lowest-charge state having $b_i a_{i-1} \ldots a_0$ as its LSBs, and program the cell into that state.

This also can be generalized to any number of bits per cell in the MSB-to-LSB programming order:

For i=M−1 to 0

Identify the current state of the cell and denote that state as $a_{M-1}a_{M-2} \ldots a_0$ if $a_i != b_i$ Starting from the current state, inspect each higher-charge state in order of increasing charge to find the lowest-charge state having $a_{M-1}a_{M-2} \ldots a_{i+1}b_i$ as its MSBs, and program the cell into that state.

As long as the state into which the cell is to be programmed is either the current state or a state of higher charge, this method will work. Because the method starts at the lowest-charge "erased" state, and because in the ith state, by operation of the method, there is no lower-charge state in which the bits of lesser significance than the current bit are $a_{i-1}a_{i-2} \ldots a_0$ (in the LSB-to-MSB case), or in which bits of greater significance than the current bit are $a_{M-1}a_{M-2} \ldots a_{i+1}$ (in the MSB-to-LSB case), either $a_i = b_i$ and no further action is taken, or $a_i \neq b_i$ and a change of state to $b_i a_{i-1} a_{i-2} \ldots a_0$ (in the LSB-to-MSB case), or to $a_{M-1}a_{M-2} \ldots a_{i+1}b_i$ (in the MSB-to-LSB case), is carried out. If a state change is carried out, it has been established above that any new state will be a higher-charge state than the current state. Therefore, no "backward" programming steps are called for by the method of the invention.

Thus it is seen that a method for sequential programming of a multilevel cell, such as a multilevel flash cell, storing M bits per cell (M≥2), regardless of the encoding scheme used, has been provided. The method can accommodate any order of sequential programming, whether cyclic, (such as from LSB to MSB), anticyclic (such as from MSB to LSB), or any other cyclic, anticyclic or random order, as long as, for whichever bit is being programmed, the cell is programmed to the lowest-charge state in which the bit position that is being programmed, as well as any other bit position that has already been programmed, has the correct value, regardless of the values of bits not yet programmed.

Such a method offers significant flexibility to the designer of a system using such multilevel memory, insofar as any encoding scheme is permitted. Moreover, the method allows partial programming under any given encoding scheme. In other words, as described above, one can program only the LSBs without knowing the MSBs, or vice-versa, rather than having to wait until all bits arrive, as long as other bits eventually do arrive. This offers both low latency and operating flexibility.

Figure 12:
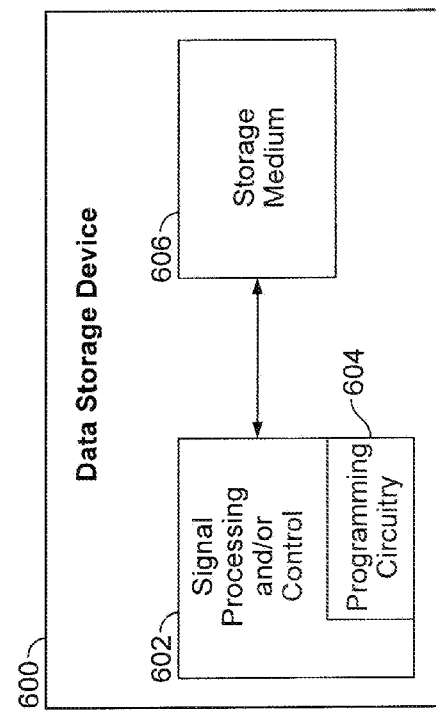
FIG. 12 is a schematic representation of an exemplary data storage device incorporating an embodiment of the present invention.
Figure 13:
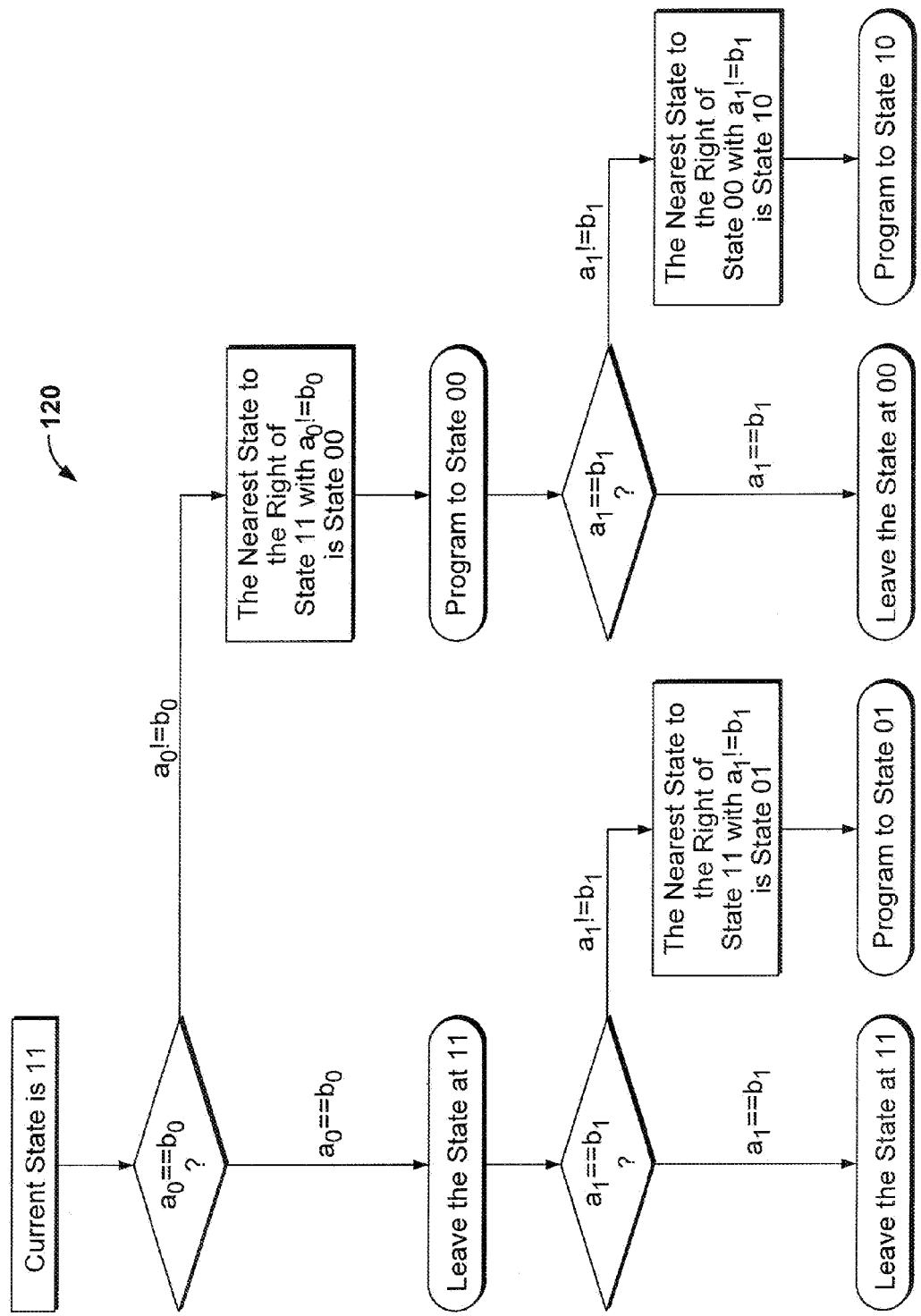
FIG. 13 is a flow diagram of an embodiment of a programming algorithm according to an embodiment of the present invention.

Referring now to FIG. 12, an exemplary implementation of the present invention is shown. The present invention can be implemented in a data storage device 600. The present invention may be implemented in either or both signal processing and/or control circuits, which are generally identified in FIG. 12 at 602. In some implementations, the signal processing and/or control circuit 602 and/or other circuits (not shown) in the data storage device 600 may process data, perform coding and/or encryption, perform calculations, and/or format data that is output to and/or received from a storage medium 606. In accordance with an embodiment of the invention, control circuit 602 may include programming circuitry 604 which includes circuitry in accordance with the invention for programming storage medium 606, in accordance, e.g., with the algorithm 120 diagrammed in FIG. 13.

It will be understood that the foregoing is only illustrative of the principles of the invention, and that the invention can be practiced by other than the described embodiments, which are presented for purposes of illustration and not of limitation, and the present invention is limited only by the claims which follow.

What is claimed is:

1. A method of operating a multi-level memory cell array to store data, the method comprising:
for each cell in the array, programming respective bits in an order of significance; and, for one bit of said bits being programmed:
changing the cell from a current charge state to a new charge state that represents said bit being programmed, any bit already programmed, and at least one bit that is not being programmed; wherein:
the new charge state is a lowest-charge state out of all possible states in which the bit being programmed, and any bits already programmed, have programmed values, independent of any value of said at least one bit that is not being programmed.

2. The method of claim 1, wherein the order of significance is cyclic.

3. The method of claim 2, wherein:
the new charge state is a lowest charge state out of all possible states in which the bit being programmed, and any bits of lesser significance, have programmed values, independent of any value of said at least one bit that is not being programmed.

4. The method of claim 1, wherein the order of significance is anticyclic.

5. The method of claim 4, wherein:
the new charge state is a lowest charge state out of all possible states in which the bit being programmed, and any bit of greater significance, have programmed values, independent of any value of said at least one bit that is not being programmed.

6. The method of claim 1, wherein the order of significance is random.

7. A memory device comprising:
a storage medium including a plurality of multilevel memory cells; and
a controller for programming the plurality of multilevel memory cells, by:
programming bits in an order of significance, and, for one bit of said bits being programmed:
changing a cell of the multilevel storage device from a current charge state to a new charge state that represents said bit being programmed, any bit already programmed, and at least one bit that is not being programmed; wherein:
the new charge state is a lowest-charge state out of all possible states in which the bit being programmed, and any bit already programmed, have programmed values, independent of any value of said at least one bit that is not being programmed.

8. The memory device of claim 7, wherein each the multilevel memory cell is a flash memory cell.

9. The memory device of claim 7, wherein the order of significance is cyclic.

10. The memory device of claim 9, wherein:
the new charge state is a lowest charge state out of all possible states in which the bit being programmed, and any bit of lesser significance, have programmed values, independent of any value of said at least one bit that is not being programmed.

11. The memory device of claim 7, wherein the order of significance is anticyclic.

12. The memory device of claim 11, wherein:
the new charge state is a lowest charge state out of all possible states in which the bit being programmed, and any bit of greater significance, have programmed values, independent of any value of said at least one bit that is not being programmed.

13. A method of storing data in a multilevel storage device, the method comprising:
programming bits in an order of significance; and, for one bit of said bits being programmed:

changing the multilevel storage device from a current charge state to a new charge state that represents said bit being programmed, any bit already programmed, and at least one bit that is not being programmed; wherein:

the new charge state is a lowest-charge state out of all possible states in which the bit being programmed, and any bit already programmed, have programmed values, independent of any value of said at least one bit that is not being programmed.

14. The method of claim 13, wherein the order of significance is cyclic.

15. The method of claim 14, wherein:

the new charge state is a lowest charge state out of all possible states in which the bit being programmed, and any bit of lesser significance, have programmed values, independent of any value of said at least one bit that is not being programmed.

16. The method of claim 13, wherein the order of significance is anticyclic.

17. The method of claim 16, wherein:

the new charge state is a lowest charge state out of all possible states in which the bit being programmed, and any bit of greater significance, have programmed values, independent of any value of said at least one bit that is not being programmed.

18. The method of claim 13, wherein the order of significance is random.

* * * * *